United States Patent [19]

Hsu et al.

[11] Patent Number: 5,759,916
[45] Date of Patent: Jun. 2, 1998

[54] METHOD FOR FORMING A VOID-FREE TITANIUM NITRIDE ANTI-REFLECTIVE COATING(ARC) LAYER UPON AN ALUMINUM CONTAINING CONDUCTOR LAYER

[75] Inventors: Te-Ming Hsu; Li-Dum Chen, both of Hsin-Chu; Shih-Huang Hsieh, Niao-Sung, all of Taiwan

[73] Assignee: Taiwan Semiconductor Manufacturing Company Ltd., Hsin-Chu, Taiwan

[21] Appl. No.: 668,710

[22] Filed: Jun. 24, 1996

[51] Int. Cl.$^6$ .................................... H05H 1/24
[52] U.S. Cl. ................ 438/636; 438/648; 438/656; 438/671; 438/685
[58] Field of Search ........................ 437/187, 192; 438/636, 648, 656, 685, 671

[56] References Cited

U.S. PATENT DOCUMENTS

| | | | |
|---|---|---|---|
| 4,820,661 | 4/1989 | Arnold, III | 430/271 |
| 5,188,979 | 2/1993 | Filipiak | 437/192 |
| 5,219,768 | 6/1993 | Abernathey | 437/187 |
| 5,231,053 | 7/1993 | Bost | 437/190 |
| 5,286,608 | 2/1994 | Koh | 430/313 |
| 5,427,666 | 6/1995 | Mueller | 204/192.17 |
| 5,449,639 | 9/1995 | Wei | 437/187 |
| 5,525,542 | 6/1996 | Maniar | 437/186 |
| 5,582,881 | 12/1996 | Besser | 427/576 |
| 5,607,776 | 3/1997 | Mueller | 428/472 |

OTHER PUBLICATIONS

Fundamentals of Semiconductor Processing Technologies, Badih El-Karen. pp. 296–298, 1995.

*Primary Examiner*—Patricia L. Morris
*Assistant Examiner*—Jean F. Vollano
*Attorney, Agent, or Firm*—George O. Saile; Stephen B. Ackerman; Alek P. Szecsy

[57] ABSTRACT

A method for forming upon a semiconductor substrate a void free titanium nitride Anti-Reflective Coating (ARC) layer upon an aluminum containing conductor layer. There is first formed upon a semiconductor substrate an aluminum containing conductor layer. There is then formed upon the aluminum containing conductor layer a titanium rich titanium nitride layer which has a titanium:nitrogen molar ratio of greater than about 1.1:1. Finally, there is formed upon the titanium rich titanium nitride layer a substantially stoichiometric titanium nitride layer which has a titanium:nitrogen molar ratio of from about 1.0:1 to about 1.1:1. Optionally, a patterned photo resist layer may be formed upon the surface of the substantially stoichiometric titanium nitride layer and the substantially stoichiometric titanium nitride layer, the titanium rich titanium nitride layer and the aluminum containing conductor layer may be sequentially patterned.

25 Claims, 4 Drawing Sheets

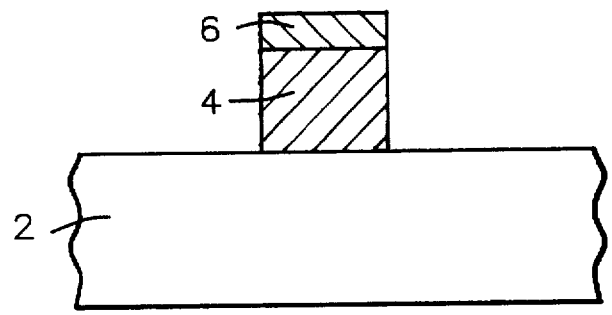
FIG. 1 - Prior Art
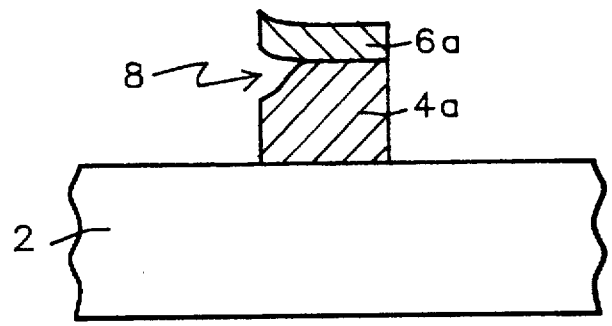
FIG. 2 - Prior Art
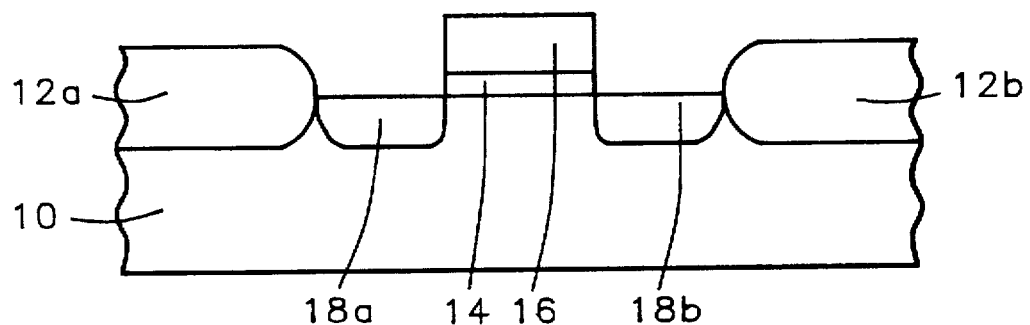
FIG. 3

METHOD FOR FORMING A VOID-FREE TITANIUM NITRIDE ANTI-REFLECTIVE COATING(ARC) LAYER UPON AN ALUMINUM CONTAINING CONDUCTOR LAYER

BACKGROUND OF THE INVENTION

1. Field of the Invention

The present invention relates generally to Anti-Reflective Coating (ARC) layers formed upon reflective conductor layers within integrated circuits. More particularly, the present invention relates to void free titanium nitride Anti-Reflective Coating (ARC) layers formed upon aluminum containing conductor layers within integrated circuits.

2. Description of the Related Art

Integrated circuits are formed upon semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers. The patterned conductor layers which connect the electrical circuit elements within integrated circuits are typically formed through patterning through photo lithographic and etching methods as are conventional in the art of blanket aluminum containing conductor layers formed of reflective aluminum or aluminum alloy conductor materials.

In the process of patterning such blanket aluminum containing conductor layers through photo lithographic and etching methods as are conventional in the art, it is common for portions of a blanket photo resist layer which are formed upon the surface of the blanket aluminum containing conductor layer to experience an inhomogeneous standing wave photo exposure due to reflection of actinic light from the surface of the blanket aluminum containing conductor layer back into portions of the blanket photo resist layer. The inhomogeneous standing wave photo exposure of the blanket photo resist layer typically provides upon development of the inhomogeneously photo exposed blanket photo resist layer an inhomogeneous patterned photo resist layer. In turn, the inhomogeneous patterned photo resist layer, when employed as a photo resist etch mask, will typically yield only an inhomogeneous patterned aluminum containing conductor layer from the blanket aluminum containing conductor layer.

In order to avoid an inhomogeneous standing wave photo exposure of portions of blanket photo resist layers employed in patterning blanket aluminum containing conductor layers within integrated circuits, it is common in the art to form directly upon the surfaces of the blanket aluminum containing conductor layers blanket Anti-Reflective Coating (ARC) layers. Although several types of blanket Anti-Reflective Coating (ARC) layers have been disclosed in the art, including but not limited to dyed polymer Anti-Reflective Coating (ARC) layers and inorganic thin film Anti-Reflective Coating (ARC) layers, it has become quite common in the art that blanket Anti-Reflective Coating (ARC) layers formed upon aluminum containing conductor layers within integrated circuits are formed of blanket titanium nitride layers. Blanket titanium nitride layers are desirable as blanket Anti-Reflective Coating (ARC) layers upon blanket aluminum containing conductor layers within integrated circuits since they readily provide adequate anti-reflective character to the blanket aluminum containing conductor layers while simultaneously typically being readily formed in-situ within the same reactor chamber within which are formed the blanket aluminum containing conductor layers.

While blanket titanium nitride Anti-Reflective Coating (ARC) layers typically serve well in attenuating reflections from blanket aluminum containing conductor layers within integrated circuits, blanket titanium nitride Anti-Reflective Coating (ARC) layers formed upon blanket aluminum containing conductor layers within integrated circuits are not entirely without problems. In particular, it is known in the art that upon exposure to thermal annealing under conditions common in the art of integrated circuit manufacture blanket or patterned titanium nitride Anti-Reflective Coating (ARC) layers will typically partially delaminate from underlying blanket or patterned aluminum containing conductor layers, thus forming voids between the partially delaminated titanium nitride Anti-Reflective Coating (ARC) layers and the aluminum containing conductor layers. Such voids are particularly detrimental within advanced integrated circuits exhibiting decreased line-widths and thicknesses since they often contribute to substantial contact resistance increases which may preclude formation of fully functional or reliable integrated circuits.

A pair of schematic cross-sectional diagrams illustrating such void formation due to partial delamination of a titanium nitride Anti-Reflective Coating (ARC) layer formed upon an aluminum containing conductor layer through a method conventional in the art is shown in FIG. 1 and FIG. 2. Shown in FIG. 1 is a substrate layer 2 upon which is formed a patterned aluminum containing conductor layer 4. Upon the patterned aluminum containing conductor layer 4 in turn is formed a patterned titanium nitride Anti-Reflective Coating (ARC) layer 6. Upon exposure to thermal annealing at temperature as low as about 450 degrees centigrade for a time period as short as about 120 minutes, as is common in the art of integrated circuit manufacture, there is formed as shown in FIG. 2 a partially delaminated annealed patterned titanium nitride Anti-Reflective Coating (ARC) layer 6a upon an annealed patterned aluminum containing conductor layer 4a, with the attendant formation of a void 8. The underlying basis for the partial delamination and void formation presumably derives from a mis-match in the coefficients of thermal expansion of the patterned titanium nitride Anti-Reflective Coating (ARC) layer 6 and the patterned aluminum containing conductor layer 4.

It is thus towards the goal of forming within integrated circuits titanium nitride Anti-Reflective Coating (ARC) layers upon aluminum containing conductor layers without partial delamination and void formation upon thermal annealing of those two layers that the present invention is directed.

Novel methods through which titanium containing materials may be employed in forming within integrated circuits Anti-Reflective Coating (ARC) layers upon reflective metal substrate layers have been disclosed in the art. For example, Koh, in U.S. Pat. No. 5,286,608 discloses a method for forming upon a reflective metal layer within an integrated circuit a titanium oxide Anti-Reflective Coating (ARC) layer.

Desirable in the art are additional novel methods through which titanium nitride Anti-Reflective Coating (ARC) layers may be formed upon reflective aluminum containing conductor layers within integrated circuits. Particularly desirable are additional novel methods which avoid partial delamination and void formation upon thermal annealing of the semiconductor substrates upon which are formed the titanium nitride Anti-Reflective Coating (ARC) layers and the aluminum containing conductor layers.

SUMMARY OF THE INVENTION

A first object of the present invention is to provide a method for forming upon a semiconductor substrate a titanium nitride Anti-Reflective Coating (ARC) layer upon an aluminum containing conductor layer.

A second object of the present invention is to provide a method in accord with the first object of the present invention, where upon thermal annealing of the semiconductor substrate a void is not formed through partial delamination of the titanium nitride Anti-Reflective Coating (ARC) layer from the aluminum containing conductor layer.

A third object of the present invention is to provide a method in accord with the first object of the present invention and the second object of the present invention, which method is readily manufacturable.

In accord with the objects of the present invention, there is provided through the present invention a method for forming upon a semiconductor substrate a void free titanium nitride Anti-Reflective Coating (ARC) layer upon an aluminum containing conductor layer. To practice the method of the present invention, there is first formed upon a semiconductor substrate an aluminum containing conductor layer. There is then formed upon the aluminum containing conductor layer a titanium rich titanium nitride layer. The titanium rich titanium nitride layer has a titanium:nitrogen molar ratio of greater than about 1.1:1. Finally, there is formed upon the titanium rich titanium nitride layer a substantially stoichiometric titanium nitride layer. The substantially stoichiometric titanium nitride layer has a titanium:nitrogen molar ratio of from about 1.0:1 to about 1.1:1. Together, the titanium rich titanium nitride layer and the substantially stoichiometric titanium nitride layer form the void free titanium nitride Anti-Reflective Coating (ARC) layer of the present invention. Optionally, a patterned photo resist layer may be formed upon the surface of the substantially stoichiometric titanium nitride layer. The substantially stoichiometric titanium nitride layer, the titanium rich titanium nitride layer and the aluminum containing conductor layer may then be sequentially patterned to form a patterned void free titanium nitride Anti-Reflective Coating (ARC) layer upon a patterned aluminum containing conductor layer.

The present invention provides a method for forming upon a semiconductor substrate a titanium nitride Anti-Reflective Coating (ARC) layer upon an aluminum containing conductor layer, where upon thermal annealing of the semiconductor substrate a void is not formed through partial delamination of the titanium nitride Anti-Reflective Coating (ARC) layer from the aluminum containing conductor layer. Although the mechanism by which voids formed through partial delamination of titanium nitride Anti-Reflective Coating (ARC) layers from aluminum containing conductor layers within integrated circuits is not entirely well understood, it is nonetheless presumed that varying coefficients of thermal expansion of the materials from which are formed those layers leads to stresses within those layers which play a significant role in such void formation. While the mechanism through which the method of the present invention controls or modifies those stresses is not well understood, it is nonetheless clear that through the method of the present invention there may be formed upon a semiconductor substrate a titanium nitride Anti-Reflective Coating (ARC) layer upon an aluminum containing conductor layer, where upon thermal annealing of the semiconductor substrate a void is not formed through partial delamination of the titanium nitride Anti-Reflective Coating (ARC) layer from the aluminum containing conductor layer.

The method of the present invention is readily manufacturable. The method of the present invention provides that a void free titanium nitride Anti-Reflective Coating (ARC) layer may be formed upon an aluminum containing conductor layer through forming a titanium rich titanium nitride layer upon the aluminum containing conductor layer and subsequently forming a substantially stoichiometric titanium nitride layer upon the titanium rich titanium nitride layer. A specific method and material through which the titanium content within the titanium rich titanium nitride layer and the substantially stoichiometric titanium nitride layer may be controlled is also provided within this disclosure. The disclosed method and material derive from modifications of methods and materials which are otherwise known in the art of forming titanium nitride Anti-Reflective Coating (ARC) layers within integrated circuits. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating void formation due to partial delamination incident to thermal annealing of a patterned titanium nitride Anti-Reflective Coating (ARC) layer formed upon a patterned aluminum containing conductor layer through a method conventional to the art.

FIG. 3 to FIG. 7 show a series of schematic cross-sectional diagrams illustrating the results of progressive process steps in forming within an integrated circuit multiple patterned void free titanium nitride Anti-Reflective Coating (ARC) layers upon multiple patterned aluminum containing conductor layers through the method of the present invention.

DESCRIPTION OF THE PREFERRED EMBODIMENT

Figure 4:
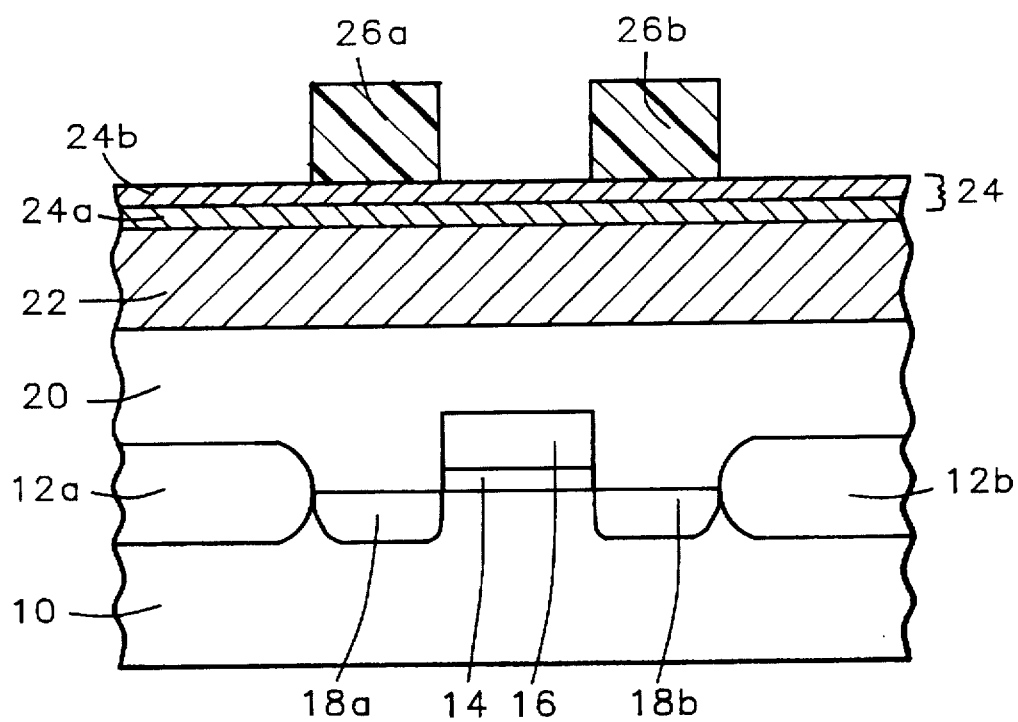

The present invention provides a method for forming upon a semiconductor substrate a void free titanium nitride Anti-Reflective Coating (ARC) layer upon an aluminum containing conductor layer. The method of the present invention provides the void free titanium nitride Anti-Reflective Coating (ARC) layer upon the aluminum containing conductor layer through first forming upon a semiconductor substrate an aluminum containing conductor layer. Upon the aluminum containing conductor layer is then formed a titanium rich titanium nitride layer. The titanium rich titanium nitride layer has a titanium:nitrogen molar ratio of at least about 1.1:1. Formed then upon the titanium rich titanium nitride layer is a substantially stoichiometric titanium nitride layer. The substantially stoichiometric titanium nitride layer has a titanium:nitrogen molar ratio of from about 1.0:1 to about 1.1:1. Together, the titanium rich titanium nitride layer and the substantially stoichiometric titanium nitride layer form the void free titanium nitride Anti-Reflective Coating (ARC) layer of the present invention. The void free titanium nitride Anti-Reflective Coating (ARC) layer and the underlying aluminum containing conductor layer may optionally be sequentially patterned through methods as are conventional in the art. The semiconductor substrate upon which is formed the void free titanium nitride Anti-Reflective Coating (ARC) layer and the aluminum containing conductor layer may subsequently be thermally annealed without forming voids which are typically encountered through partial delamination of the titanium nitride Anti-Reflective Coating (ARC) layers from the aluminum containing conductor layers formed upon semiconductor substrates through methods conventional in the art.

The method of the present invention may be employed in forming void free titanium nitride Anti-Reflective Coating (ARC) layers upon aluminum containing conductor layers within integrated circuits including but not limited to Dynamic Random Access Memory (DRAM) integrated circuits, Static Random Access Memory (SRAM) integrated circuits, Application Specific Integrated Circuits (ASICs), logic integrated circuits, integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention may also be employed in forming void free titanium nitride Anti-Reflective Coating (ARC) layers upon aluminum containing conductor layers within various locations within integrated circuits. The method of the present invention may be employed in forming a void free titanium nitride Anti-Reflective Coating (ARC) layer upon a first aluminum containing conductor layer most closely adjoining the semiconductor substrate within an integrated circuit. Alternatively, the method of the present invention may also be employed in forming void free titanium nitride Anti-Reflective Coating (ARC) layers upon aluminum containing conductor layers further removed from the semiconductor substrate within the integrated circuit. Thus, the method of the present invention has broad applicability in forming void free titanium nitride Anti-Reflective Coating (ARC) layers upon aluminum containing conductor layers within various types and locations of integrated circuits.

Referring now to FIG. 3 to FIG. 7 there is shown a series of schematic cross-sectional diagrams illustrating the results of progressive process steps in forming within an integrated circuit multiple patterned void free titanium nitride Anti-Reflective Coating (ARC) layers upon aluminum containing conductor layers through the preferred embodiment of the method of the present invention. Shown in FIG. 3 is a schematic cross-sectional diagram of the integrated circuit at its early stages of formation.

Shown in FIG. 3 is a semiconductor substrate 10 within and upon whose surface is formed a pair of isolation regions 12a and 12b which define the active region of the semiconductor substrate 10. Although semiconductor substrates are known in the art to possess either of two dopant types, various dopant concentrations and various crystallographic orientations, the semiconductor substrate 10 upon which is practiced the preferred embodiment of the method of the present invention is preferably a (100) silicon semiconductor substrate 10 having a N- or P- doping.

As is also shown in FIG. 3, there is formed within and upon the active region of the semiconductor substrate 10, as defined by the isolation regions 12a and 12b, a Field Effect Transistor (FET) comprising a gate oxide layer 14 upon which is formed and aligned a gate electrode 16, and a pair of source/drain regions 18a and 18b formed into the semiconductor substrate 10 at areas not occupied by the gate oxide layer 14 and the gate electrode 16. The gate oxide layer 14, the gate electrode 16 and the source/drain electrode regions 18a and 18b may be formed through methods as are conventional in the art of forming within integrated circuits Field Effect Transistors (FETs). For example, the gate oxide layer 14 may typically, although not exclusively, be formed through patterning through methods as are conventional in the art of a blanket gate oxide layer formed through thermal oxidation of the active region of the semiconductor substrate 10 at a temperature of from about 800 to about 900 degrees centigrade to form a blanket gate oxide layer of typical thickness from about 80 to about 125 angstroms. In addition, the gate electrode 14 may typically be formed through patterning through methods as are conventional in the art of a blanket layer of highly doped polysilicon gate electrode material formed upon the blanket gate oxide layer at a thicknesses of from about 1000 to about 1500 angstroms. Finally, the source/drain regions 18a and 18b may typically be formed into the active region of the semiconductor substrate 10 at areas not occupied by the gate oxide layer 14 and the gate electrode 16 through ion implanting a suitable dopant into those regions at an ion implant dose of from about 1E12 to about 1E13 dopant atoms per square centimeter and an ion implantation energy of from about 30 to about 70 keV.

Referring now to FIG. 4, there is shown a schematic cross-sectional diagram illustrating the results of further processing of the integrated circuit whose schematic cross-sectional diagram is illustrated in FIG. 3. Shown in FIG. 4 is a schematic cross-sectional diagram of an integrated circuit corresponding with the schematic cross-sectional diagram of the integrated circuit illustrated in FIG. 3, and upon whose surface is formed a planarized Pre-Metal Dielectric (PMD) layer 20. Methods and materials through which planarized Pre-Metal Dielectric (PMD) layers may be formed within integrated circuits are known in the art of integrated circuit manufacture. Planarized Pre-Metal Dielectric (PMD) layers are typically formed within integrated circuits through planarizing through methods as are conventional in the art of conformal Pre-Metal Dielectric (PMD) layers formed within those integrated circuits. Conformal Pre-Metal Dielectric (PMD) layers may be formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods through which may be formed conformal Pre-Metal Dielectric (PMD) layers of dielectric materials including but not limited to silicon oxide dielectric materials, silicon nitride dielectric materials and silicon oxynitride dielectric materials. The conformal Pre-Metal Dielectric (PMD) layers so formed within integrated circuits may then be planarized to form planarized Pre-Metal Dielectric (PMD) layers through methods including but not limited to Reactive Ion Etch (RIE) etch-back planarizing methods and Chemical Mechanical Polish (CMP) planarizing methods. For the preferred embodiment of the method of the present invention, the planarized Pre-Metal Dielectric (PMD) layer 20 is preferably formed from a conformal Pre-Metal Dielectric (PMD) layer formed of a silicon oxide dielectric material deposited through a Plasma Enhanced Chemical Vapor Deposition (PECVD) method, as is common in the art. Preferably, the conformal Pre-Metal Dielectric (PMD) layer so formed is planarized to form the planarized Pre-Metal Dielectric (PMD) layer 20 through a Chemical Mechanical Polish (CMP) planarizing method, as is also common in the art. Preferably, the planarized Pre-Metal Dielectric (PMD) layer 20 is from about 10000 to about 20000 angstroms thick.

Also shown in FIG. 4 is a blanket first aluminum containing conductor layer 22 formed upon the surface of the planarized Pre-Metal Dielectric (PMD) layer 20. Although there are known in the art several methods and materials through which blanket aluminum containing conductor layers may be formed within integrated circuits, for the preferred embodiment of the method of the present invention, the blanket first aluminum containing conductor layer 22 is preferably formed through a method which provides a blanket first aluminum containing conductor layer 22 of sufficient reflectivity such that an Anti-Reflective Coating (ARC) layer is needed to prevent inhomogeneous photo exposure of a photoresist employed in patterning the blanket first aluminum containing conductor layer 22. Thus, any of several methods and materials may be employed in forming the blanket first aluminum containing conductor layer 22, including but not limited to thermal evaporation methods, electron beam assisted evaporation methods and Physical Vapor Deposition (PVD) sputtering methods which employ aluminum source materials and targets as are appropriate to the deposition method. Preferably, the blanket first aluminum containing conductor layer 22 has an aluminum content of greater than about 98 percent, and includes suitable alloy materials such as silicon and copper which are common in the art of integrated circuit manufacture. Preferably, the blanket first aluminum containing conductor layer 22 is from about 3000 to about 6000 angstroms thick.

Also shown in FIG. 4 is the presence of (1) a blanket first titanium rich titanium nitride layer 24a formed upon the surface of the blanket first aluminum containing conductor layer 22; and (2) a blanket first substantially stoichiometric titanium nitride layer 24b formed upon the surface of the blanket first titanium rich titanium nitride layer 24a. Together, the blanket first titanium rich titanium nitride layer 24a and the blanket first substantially stoichiometric titanium nitride layer 24b form a blanket first void free titanium nitride Anti-Reflective Coating (ARC) layer 24 within the integrated circuit formed through the preferred embodiment of the method of the present invention.

Although there are several methods and materials through which titanium nitride Anti-Reflective Coating (ARC) layers may be formed within integrated circuits, including but not limited to Chemical Vapor Deposition (CVD) methods and Physical Vapor Deposition (PVD) sputtering methods, for the preferred embodiment of the method of the present invention, the blanket first titanium rich titanium nitride layer 24a and the blanket first substantially stoichiometric titanium nitride layer 24b are preferably formed through a sequential in-situ Physical Vapor Deposition (PVD) sputtering method employing a titanium target.

To form the blanket titanium rich titanium nitride layer 24a, the titanium target preferably has formed upon its surface a titanium rich titanium nitride layer which is sputtered from the target within an argon sputtering atmosphere. The titanium rich titanium nitride layer may be formed upon the surface of the titanium target through in-situ nitrogen plasma processing of the titanium target at: (1) a DC plasma power of from about 3000 to about 9000 watts; (2) a reactor chamber pressure of from about 2 to about 10 mtorr; and (3) a nitrogen flow rate of from about 20 to about 200 standard cubic centimeters per minute (sccm).

The preferred conditions under which the titanium rich titanium nitride layer is sputtered from the titanium target within the argon sputtering atmosphere to form the blanket first titanium rich titanium nitride layer 24a include: (1) a DC power of from about 3000 to about 9000 watts; (2) a reactor chamber pressure of from about 2 to about 10 mtorr; (3) a substrate temperature of from about 0 to about 300 degrees centigrade; and (4) an argon flow rate of from about 20 to about 200 standard cubic centimeters per minute (sccm). Under these conditions, there is formed the blanket first titanium rich titanium nitride layer 24a having a titanium:nitrogen molar ratio preferably greater than about 1.1:1. More preferably, the blanket first titanium rich titanium nitride layer 24 has a titanium:nitrogen molar ratio of from about 1.1:1 to about 1.2:1. Preferably, the blanket first titanium rich titanium nitride layer 24a is formed upon the surface of the blanket first aluminum containing conductor layer 22 to a thickness of from about 10 to about 200 angstroms, which will typically take from about 0.5 to about 10 seconds when employing the argon sputtering atmosphere conditions as disclosed above.

In order to form in-situ the blanket first substantially stoichiometric titanium nitride layer 24b upon the blanket first titanium rich titanium nitride layer 24a, the argon sputtering atmosphere in which the titanium target is sputtered to form the blanket first titanium rich titanium nitride layer 24a is changed to an argon-nitrogen sputtering atmosphere. Typically and preferably, the in-situ change in sputtering atmosphere from the argon sputtering atmosphere to the argon-nitrogen sputtering atmosphere will have a brief intervening stabilization period of from about 5 to about 20 seconds with no radio frequency power applied to the reactor chamber, in order to fully stabilize the argon and nitrogen flow rates. Following this stabilization period, there is formed the blanket first substantially stoichiometric titanium nitride layer 24b within an argon-nitrogen sputtering atmosphere under conditions which preferably include: (1) a DC power of from about 3000 to about 9000 watts; (2) a reactor chamber pressure of from about 2 to about 10 mtorr; (3) a substrate temperature of from about 0 to about 300 degrees centigrade; (4) an argon flow rate of from about 20 to about 200 standard cubic centimeters per minute; and (5) a nitrogen flow rate of from about 20 to about 200 standard cubic centimeters per minute. Under these conditions, there is formed the blanket first substantially stoichiometric titanium nitride layer 24b preferably having a titanium:nitrogen molar ratio of from about 1.0:1 to about 1.1:1. Preferably, the blanket first substantially stoichiometric titanium nitride layer 24b is formed to a thickness of from about 50 to about 1500 angstroms, which will typically take from about 2.5 to about 75 seconds under the argon-nitrogen sputtering atmosphere conditions disclosed above.

Finally, there is also shown in FIG. 4 the presence of a pair of patterned first photo resist layers 26a and 26b which will be employed in subsequently sequentially patterning the blanket first substantially stoichiometric titanium nitride layer 24b, the blanket first titanium rich titanium nitride layer 24a and the blanket first aluminum containing conductor layer 22. The pair of patterned first photo resist layers 26a and 26b may be formed through methods as are conventional in the art, provided that the pair of patterned first photo resist layers 26a and 26b are formed of a photo resist material having limited susceptibility to degradation in the etchants employed in sequentially patterning the blanket first substantially stoichiometric titanium nitride layer 24b, the blanket first titanium rich titanium nitride layer 24a and the blanket first aluminum containing conductor layer 22.

Figure 5:
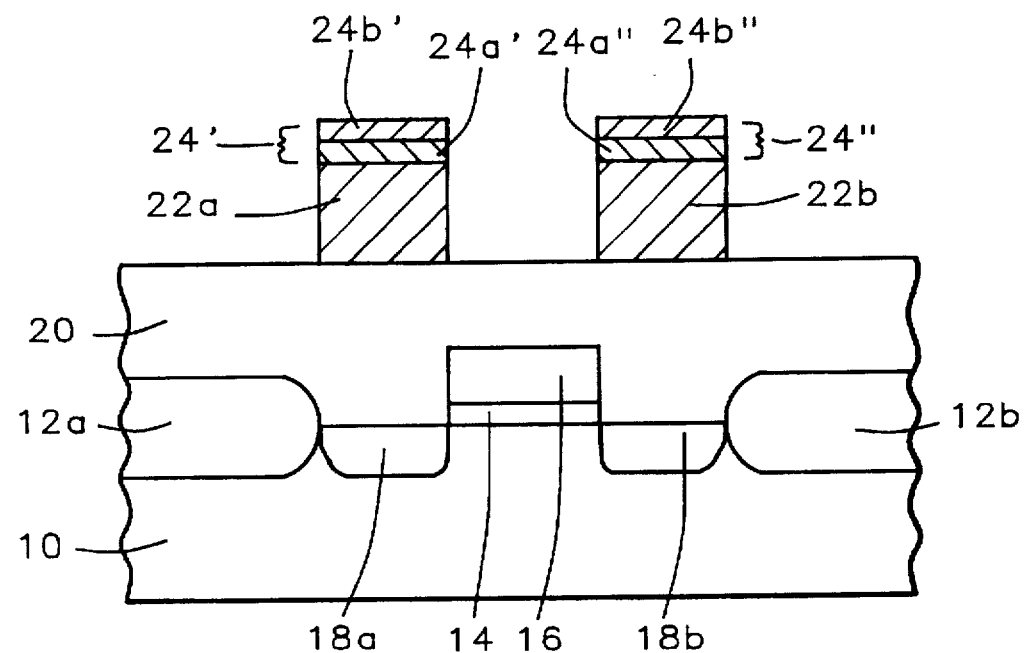

Referring now to FIG. 5 there is shown a schematic cross-sectional diagram illustrating the results of further processing of the integrated circuit whose schematic cross-sectional diagram is illustrated in FIG. 4. Shown in FIG. 5 is the result of sequentially patterning through methods as are conventional in the art the blanket first substantially stoichiometric titanium nitride layer 24b, the blanket first titanium rich titanium nitride layer 24a and the blanket first aluminum containing conductor layer 22. Although other methods may be employed, the blanket first substantially stoichiometric titanium nitride layer 24b, the blanket first titanium rich titanium nitride layer 24a and the blanket first aluminum containing conductor layer 22 are preferably patterned sequentially in-situ through a Reactive Ion Etch (RIE) dry plasma etch method. Through this patterning there is shown in FIG. 5 the presence of the patterned first aluminum containing conductor layers 22a and 22b, upon which are formed and aligned the corresponding patterned first titanium rich titanium nitride layers 24a' and 24a, upon which in turn are formed and aligned the corresponding patterned first substantially stoichiometric titanium nitride layers 24b' and 24b". Each of the patterned first titanium rich titanium nitride layers 24a' or 24a" in conjunction with the corresponding patterned first substantially stoichiometric titanium nitride layers 24b' or 24b" forms a patterned first void free titanium nitride Anti-Reflective Coating (ARC) layer 24' or 24". The patterned first void free titanium nitride Anti-Reflective Coating (ARC) layers 24' and 24" are not susceptible to void formation due to partial delamination of the patterned first void free titanium nitride Anti-Reflective Coating (ARC) layers 24' and 24" from the corresponding patterned first aluminum containing conductor layers 22a and 22b under thermal annealing of the integrated circuit whose schematic cross-sectional diagram is illustrated in FIG. 5.

As is understood by a person skilled in the art, the void free titanium nitride Anti-Reflective Coating (ARC) layers formed through the method of the present invention may be formed in locations within integrated circuits other than upon the blanket first aluminum containing conductor layer 22 or the patterned first aluminum containing conductor layers 22a and 22b. In that regard, a pair of schematic cross sectional diagrams illustrating the results of forming within the integrated circuit whose schematic cross-sectional diagram is illustrated in FIG. 5 a pair of patterned second void free titanium nitride Anti-Reflective Coating (ARC) layers is shown by reference to the schematic cross-sectional diagrams illustrated in FIG. 6 and FIG. 7.

Figure 6:
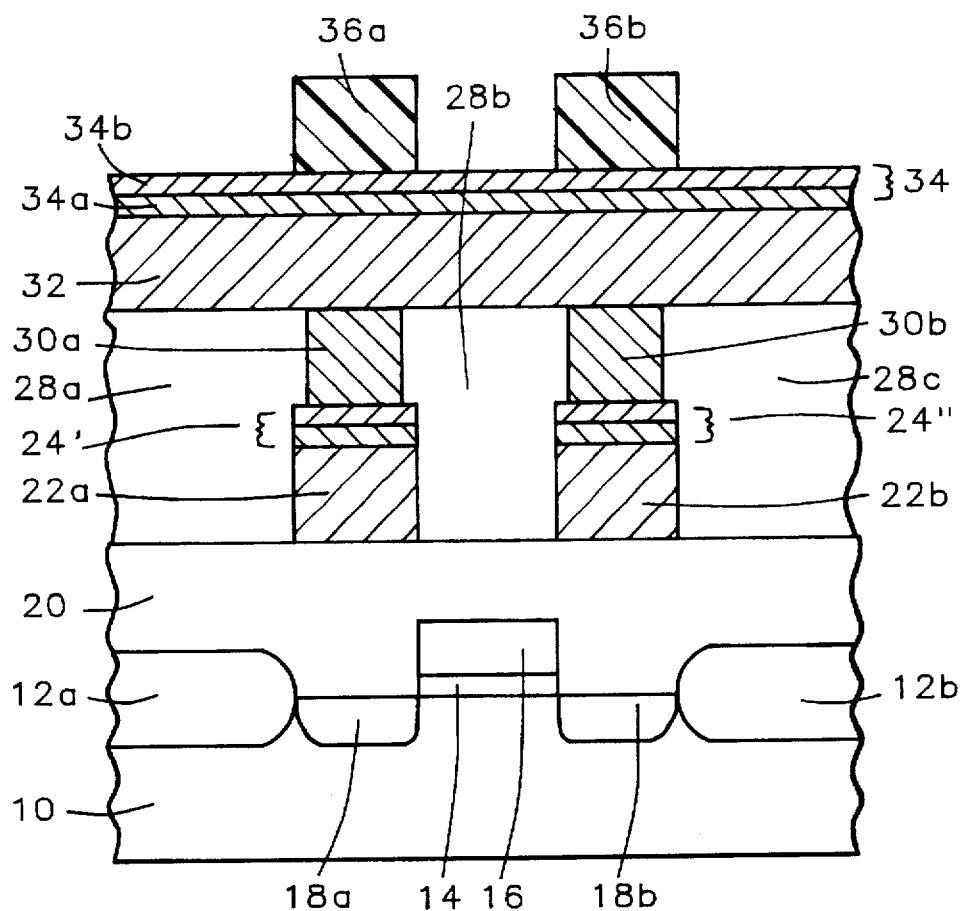

Shown in FIG. 6 is a schematic cross-sectional diagram of an integrated circuit analogous to the integrated circuit whose schematic cross-sectional diagram is illustrated in FIG. 5 and upon whose surface has been formed the patterned planarized Inter-Metal Dielectric (IMD) layers 28a, 28b and 28c. Methods and materials through which the patterned planarized Inter-Metal Dielectric (IMD) layers 28a, 28b and 28c may be formed are conventional to the art of integrated circuit manufacture. For the preferred embodiment of the method of the present invention, the patterned planarized Inter-Metal Dielectric (IMD) layers 28a, 28b and 28c may be formed and planarized through methods, materials and dimensions analogous to the methods, materials and dimensions through which is formed and planarized the planarized Pre-Metal Dielectric (PMD) layer 20. The patterned planarized Inter-Metal Dielectric (aDM) layers 28a, 28b and 28c may additionally be patterned through photo lithographic methods and etch methods as are known in the art, including but not limited to wet chemical etch methods and Reactive Ion Etch (RIE) dry plasma etch methods. For the preferred embodiment of the method of the present invention, the patterned planarized Inter-Metal Dielectric (IMD) layers 28a, 28b and 28c are preferably from about 5000 to about 20000 angstroms thick, and the apertures between the patterned planarized Inter-Metal Dielectric (MD) layers 28a and 28b, and the patterned planarized Inter-Metal Dielectric (MD) layers 28b and 28c are preferably etched sufficiently deeply to reach the surfaces of the corresponding patterned first void free titanium nitride Anti-Reflective Coating (ARC) layers 24' and 24".

There is also shown in FIG. 6 the presence of a pair of first conductive interconnection studs 30a and 30b formed into the apertures between the patterned planarized Inter-Metal Dielectric (IMD) layers 28a, 28b and 28c, and making contact with the corresponding surfaces of the patterned first void free titanium nitride Anti-Reflective Coating (ARC) layers 24' and 24". Methods and materials through which may be formed conductive interconnection studs within integrated circuits are known in the art of integrated circuit manufacture. Conductive interconnection studs my be formed within integrated circuits through methods including but not limited to thermal evaporation methods, electron beam assisted evaporation methods and Chemical Vapor Deposition (CVD) methods through which may be formed conductive interconnection studs of conductive materials including but not limited to metals, metal alloys and polysilicon. For the preferred embodiment of the method of the present invention, the pair of conductive interconnection studs 30a and 30b is preferably formed at least in part of tungsten metal deposited through a Chemical Vapor Deposition (CVD) method, as is common in the art of integrated circuit manufacture. In addition, the pair of conductive interconnection studs 30a and 30b is formed to a height sufficient to reach the upper surfaces of the patterned planarized Inter-Metal Dielectric (IMD) layers 28a, 28b and 28c.

Also shown in FIG. 6 is the presence of (1) a blanket second aluminum containing conductor layer 32 formed upon the exposed surfaces of the patterned planarized Inter-Metal Dielectric (IMD) layers 28a, 28b and 28c and the pair of conductive interconnection studs 30a and 30b; (2) a blanket second titanium rich titanium nitride layer 34a formed upon the blanket second aluminum containing conductor layer 32; (3) a blanket second substantially stoichiometric titanium nitride layer 34b formed upon the blanket second titanium rich titanium nitride layer 34a; and (4) and a pair of patterned second photo resist layers 36a and 36b formed upon the blanket second substantially stoichiometric titanium nitride layer 34b. Together, the blanket second titanium rich titanium nitride layer 34a and the blanket second substantially stoichiometric titanium nitride layer 34b form a blanket second void free titanium nitride Anti-Reflective Coating (ARC) layer 34 within the integrated circuit whose schematic cross-sectional diagram is illustrated in FIG. 6. The blanket second aluminum containing conductor layer 32, the blanket second titanium rich titanium nitride layer 34a, the blanket second substantially stoichiometric titanium nitride layer 34b and the patterned second photo resist layers 36a and 36b are formed through methods, materials and dimensions analogous to the methods, materials and dimensions through which are formed the corresponding blanket first aluminum containing conductor layer 22, the blanket first titanium rich titanium nitride layer 24a, the blanket first substantially stoichiometric titanium nitride layer 24b and the patterned first photo resist layers 26a and 26b.

Figure 7:
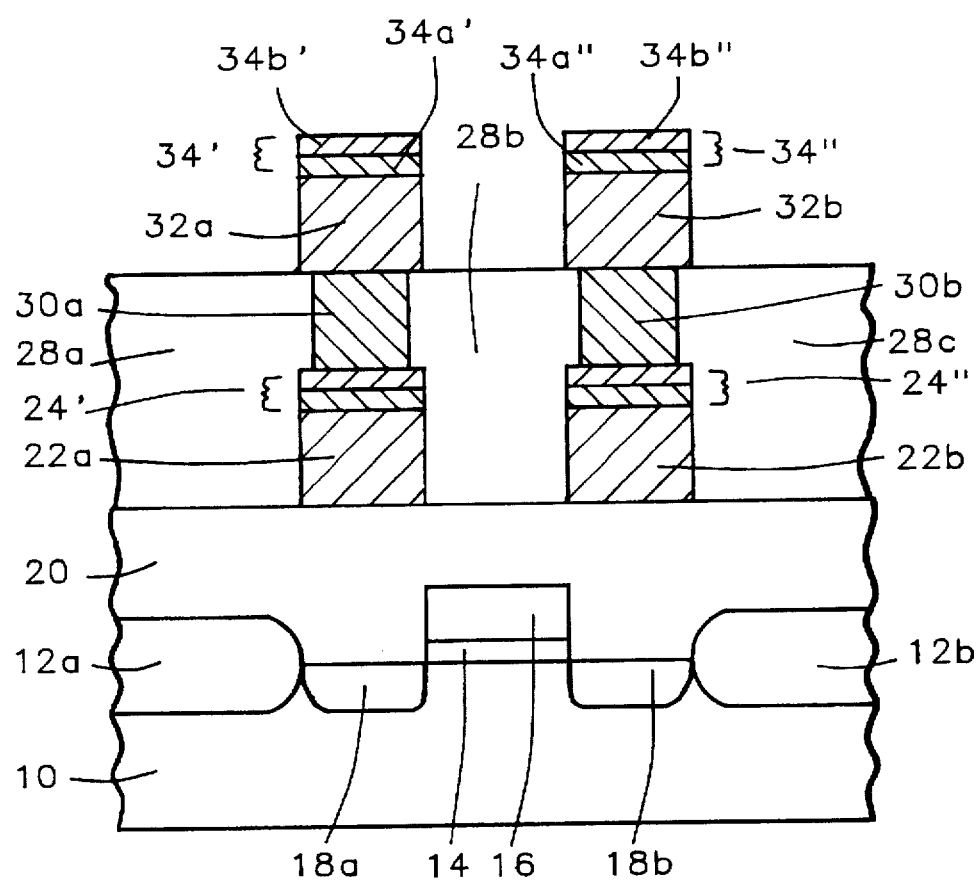

Referring now to FIG. 7, there is shown a schematic cross-sectional diagram illustrating the results of further processing of the integrated circuit whose schematic cross-sectional diagram is illustrated in FIG. 6. Shown in FIG. 7 is the results of sequentially patterning, while employing the patterned second photo resist layers 36a and 36b as an etch mask and employing methods as are conventional in the art:

(1) the blanket second substantially stoichiometric titanium nitride layer 34b to form the patterned second substantially stoichiometric titanium nitride layers 34b' and 34b"; (2) the blanket second titanium rich titanium nitride layer 34a to form the patterned second titanium rich titanium nitride layers 34a' and 34a"; and (3) the blanket second aluminum containing conductor layer 32 to form the patterned second aluminum containing conductor layers 32a and 32b. Each of the patterned second titanium rich titanium nitride layers 34a' or 34a" in conjunction with the corresponding patterned second substantially stoichiometric titanium nitride layer 34b' or 34b" forms a patterned second void free titanium nitride Anti-Reflective Coating (ARC) layer 34' or 34". Methods and materials through which the foregoing blanket second layers are patterned to form the corresponding patterned second layers are analogous to the methods and materials through which the corresponding blanket first layers are patterned to form the corresponding patterned first layers.

Upon forming the patterned second void free titanium nitride Anti-Reflective Coating (ARC) layers 34' and 34", there is formed through the preferred embodiment of the method of the present invention an integrated circuit having formed therein multiple patterned void free titanium nitride Anti-Reflective Coating (ARC) layers upon corresponding patterned aluminum containing conductor layers. The multiple patterned void free titanium nitride Anti-Reflective Coating (ARC) layers are not susceptible to void formation through partial delamination from corresponding aluminum containing conductor layers, upon thermal annealing of the integrated circuit whose schematic cross-sectional diagram is illustrated in FIG. 7.

EXAMPLES 1-2

Upon the surfaces of two (100) silicon semiconductor substrates were formed blanket aluminum containing conductor layers of thickness about 4000 angstroms through a Physical Vapor Deposition (PVD) sputtering method employing an aluminum alloy target of aluminum:copper weight percentage composition about 99.5:0.5.

Upon the surface of one of the two wafers was then deposited a blanket void free titanium nitride Anti-Reflective Coating (ARC) layer in accord with the preferred embodiment of the method of the present invention. The blanket void free titanium nitride Anti-Reflective Coating (ARC) layer was formed through a Physical Vapor Deposition (PVD) sputtering method employing a titanium target upon whose surface was formed a titanium rich titanium nitride layer. The titanium rich titanium nitride layer was formed upon the surface of the titanium target through in-situ nitrogen plasma processing of the titanium target at: (1) a DC plasma power of about 6000 watts; (2) a reactor chamber pressure of about 4 mtorr; and (3) a nitrogen flow rate of about 100 standard cubic centimeters per minute (sccm).

The method for forming the blanket void free titanium nitride Anti-Reflective Coating (ARC) layer upon the first semiconductor substrate through use of the Physical Vapor Deposition (PVD) sputtering method and the titanium target employed three process steps at a reactor chamber pressure of about 4 mtorr and a substrate temperature of about 27 degrees centigrade (i.e.: room temperature). The first process step employed: (1) a DC power of about 6500 watts; (2) an argon flow rate of about 50 standard cubic centimeters per minute (sccm); and (3) a sputtering time of about 2 seconds. The second process step employed: (1) no DC power; (2) an argon flow rate of about 50 standard cubic centimeters per minute (sccm); (3) a nitrogen flow rate of about 100 standard cubic centimeters per minute (sccm); and (4) a stabilization time of about 10 seconds. The third process step employed: (1) a DC power of about 6500 watts; (2) an argon flow rate of about 50 standard cubic centimeters per minute (sccm); (3) a nitrogen flow rate of about 100 standard cubic centimeters per minute (sccm); and (4) a sputtering time of about 14 seconds. Under these conditions, there was formed upon the surface of the blanket aluminum containing conductor layer a titanium rich titanium nitride layer of thickness about 50 angstroms and titanium:nitrogen molar ratio about 1.1:1. There was also formed upon the titanium rich titanium nitride layer a substantially stoichiometric titanium nitride layer of thickness about 250 angstroms and titanium:nitrogen molar ratio about 1:1.

Upon the blanket aluminum containing conductor layer upon the second semiconductor substrate was formed only the blanket substantially stoichiometric titanium nitride layer through the method as outlined for the first semiconductor substrate, thus yielding upon the blanket aluminum containing conductor layer upon the second semiconductor substrate a blanket substantially stoichiometric titanium nitride layer of thickness about 250 angstroms and titanium:nitrogen molar ratio of about 1:1.

The two semiconductor substrates were then reunited and patterned through photo lithographic and etching methods as are conventional in the art to form a series of parallel patterned aluminum containing conductor lines upon which resided a series of parallel patterned titanium rich titanium nitride lines and/or a series of parallel patterned substantially stoichiometric titanium nitride lines. The parallel patterned lines were about 9000 angstroms in width upon the semiconductor substrates and were separated from each other by a width of about 9000 angstroms.

The two semiconductor substrates were then thermally annealed at a temperature of about 450 degrees centigrade for a time period of about 120 minutes. The parallel patterned lines upon the semiconductor substrates were then inspected for void formation due to delamination of the patterned titanium nitride lines from the patterned aluminum containing conductor lines. The inspection was undertaken employing a Scanning Electron Microscope (SEM) at a magnification of about 30000 times. The results of the Scanning Electron Microscope (SEM) inspection are reported in TABLE I.

TABLE I

| Example | Metal Structure | Voids (per square centimeter) |
|---|---|---|
| 1 | Al/Ti rich TiN/stoichiometric TiN | 0 |
| 2 | Al/stoichiometric TiN | >10 |

From review of the data in TABLE I, it is seen that upon thermal annealing of a patterned void free titanium nitride Anti-Reflective Coating (ARC) layer formed upon a patterned aluminum containing conductor layer in accord with the preferred embodiment of the method of the present invention, there is provided a substantial reduction in void formation due to delamination of the patterned void free titanium nitride Anti-Reflective Coating (ARC) layer from the patterned aluminum containing conductor layer, in comparison with thermal annealing of patterned titanium nitride Anti-Reflective Coating (ARC) layers formed upon patterned aluminum containing conductor layers through methods as are conventional in the art.

EXAMPLES 3-7

In order to determine an optimal thickness for the titanium rich titanium nitride layer employed in forming the void free titanium nitride Anti-Reflective Coating (ARC) layer through the method of the present invention, a series of five additional semiconductor substrates was fabricated through the general method as outlined for the first semiconductor substrate within EXAMPLES 1-2, but with progressive thicknesses of the titanium rich titanium nitride layer. The progressive thicknesses of the titanium rich titanium nitride layer were provided through progressive sputtering times for the titanium rich titanium nitride layer. The results of Scanning Electron Microscopy (SEM) inspection of those semiconductor substrates is reported in TABLE II.

TABLE II

| Example | Ti rich dep time (seconds) | Ti rich thickness (angstroms) | Voids (per sq. cm) | Other Defects |
| --- | --- | --- | --- | --- |
| 3 | 1 | 25 | none | none |
| 4 | 3 | 75 | none | none |
| 5 | 5 | 125 | none | small spots |
| 6 | 7 | 175 | none | medium spots |
| 7 | 9 | 225 | none | large spots |

From review of the date in TABLE II, it is seen that void formation due to delamination of the titanium rich titanium nitride layer from the aluminum containing conductor layer is avoided through the method of the present invention over a wide thickness variation of the titanium rich titanium nitride layer. However, at increased thicknesses of the titanium rich titanium nitride layer, there is formed spots which presumably derive from a reaction of the titanium rich titanium nitride layer with the underlying aluminum containing conductor layer. The implications of these spots with regard to the functionality or reliability of an integrated circuit into which is formed those thicker titanium rich titanium nitride layers has not been investigated. Thus, on the basis of the data reported in TABLE II, the preferred thickness of the titanium rich titanium nitride layer is within the thinner range as disclosed within the preferred embodiment of the method of the present invention.

As is understood by a person skilled in the art, the preferred embodiment and EXAMPLES of the present invention are illustrative of the present invention rather than limiting of the present invention. Modifications and revisions may be made to the methods, materials, structures and dimensions through which are formed the preferred embodiment and EXAMPLES of the present invention while still forming embodiments and EXAMPLES which are within the spirit and scope of the present invention, as defined by the following Claims.

What is claimed is:

1. A method for forming upon a semiconductor substrate a void free titanium nitride Anti-Reflective Coating (ARC) layer upon an aluminum containing conductor layer comprising:

forming upon a semiconductor substrate an aluminum containing conductor layer;

forming upon the aluminum containing conductor layer a titanium rich titanium nitride layer, the titanium rich titanium nitride layer having a titanium:nitrogen molar ratio of greater than 1.1:1 to about 1.2:1; and forming upon the titanium rich titanium nitride layer a substantially stoichiometric titanium nitride layer, the substantially stoichiometric titanium nitride layer having a titanium:nitrogen molar ratio of from about 1.0:1 to no greater than 1.1:1.

2. The method of claim 1 wherein:

the titanium rich titanium nitride layer has a thickness of from about 10 to about 200 angstroms;

the substantially stoichiometric titanium nitride layer has a thickness of from about 50 to about 1500 angstroms; and the titanium rich titanium nitride layer promotes adhesion of the substantially stoichiometric titanium nitride layer to the aluminum containing conductor layer.

3. The method of claim 1 wherein the titanium rich titanium nitride layer and the substantially stoichiometric titanium nitride layer are formed sequentially in-situ through a Physical Vapor Deposition (PVD) sputtering method employing a titanium target.

4. The method of claim 3 wherein the titanium target has a second titanium rich titanium nitride layer formed upon the surface of the titanium target.

5. The method of claim 4 wherein the second titanium rich titanium nitride layer is formed upon the surface of the titanium target through in-situ nitrogen plasma processing of the titanium target.

6. The method of claim 4 wherein the titanium target is sequentially sputtered in-situ in an argon sputtering atmosphere followed by an argon:nitrogen sputtering atmosphere.

7. A method for forming within an integrated circuit a void free titanium nitride Anti-Reflective Coating (ARC) layer upon an aluminum containing conductor layer comprising:

forming within and upon a semiconductor substrate a series of semiconductor devices;

forming over the semiconductor substrate and the semiconductor devices an aluminum containing conductor layer;

forming upon the aluminum containing conductor layer a titanium rich titanium nitride layer, the titanium rich titanium nitride layer having a titanium:nitrogen molar ratio of greater than 1.1:1 to about 1.2:1; and forming upon the titanium rich titanium nitride layer a substantially stoichiometric titanium nitride layer, the substantially stoichiometric titanium nitride layer having a titanium:nitrogen molar ratio of from about 1.0:1 to no greater than 1.1:1.

8. The method of claim 7 wherein:

the titanium rich titanium nitride layer has a thickness of from about 10 to about 200 angstroms;

the substantially stoichiometric titanium nitride layer has a thickness of from about 50 to about 1500 angstroms; and the titanium rich titanium nitride layer promotes adhesion of the substantially stoichiometric titanium nitride layer to the aluminum containing conductor layer.

9. The method of claim 7 wherein the titanium rich titanium nitride layer and the substantially stoichiometric titanium nitride layer are formed sequentially in-situ through a Physical Vapor Deposition (PVD) sputtering method employing a titanium target.

10. The method of claim 9 wherein the titanium target has a second titanium rich titanium nitride layer formed upon the surface of the titanium target.

11. The method of claim 10 wherein the second titanium rich titanium nitride layer is formed upon the surface of the titanium target through in-situ nitrogen plasma processing of the titanium target.

12. The method of claim 10 wherein the titanium target is sequentially sputtered in-situ in an argon sputtering atmosphere followed by an argon:nitrogen sputtering atmosphere.

13. A method for forming within an integrated circuit a void free patterned titanium nitride Anti-Reflective Coating (ARC) layer aligned upon a patterned aluminum containing conductor layer comprising:

forming within and upon a semiconductor substrate a series of semiconductor devices;

forming over the semiconductor substrate and the semiconductor devices an aluminum containing conductor layer;

forming upon the aluminum containing conductor layer a titanium rich titanium nitride layer, the titanium rich titanium nitride layer having a titanium:nitrogen molar ratio of greater than 1.1:1 to about 1.2:1;

forming upon the titanium rich titanium nitride layer a substantially stoichiometric titanium nitride layer, the substantially stoichiometric titanium nitride layer having a titanium:nitrogen molar ratio of from about 1.0:1 to no greater than 1.1:1;

forming upon the substantially stoichiometric titanium nitride layer a patterned photo resist layer; and patterning sequentially while employing the patterned photo resist layer as an etch mask the substantially stoichiometric titanium nitride layer, the titanium rich titanium nitride layer and the aluminum containing conductor layer to form a patterned substantially stoichiometric titanium nitride layer, a patterned titanium rich titanium nitride layer and a patterned aluminum containing conductor layer.

14. The method of claim 13 wherein:

the titanium rich titanium nitride layer has a thickness of from about 10 to about 200 angstroms;

the substantially stoichiometric titanium nitride layer has a thickness of from about 50 to about 1500 angstroms; and the patterned titanium rich titanium nitride layer promotes adhesion of the patterned substantially stoichiometric titanium nitride layer to the patterned aluminum containing conductor layer.

15. The method of claim 13 wherein the titanium rich titanium nitride layer and the substantially stoichiometric titanium nitride layer are formed sequentially in-situ through a Physical Vapor Deposition (PVD) sputtering method employing a titanium target.

16. The method of claim 15 wherein the titanium target has a second titanium rich titanium nitride layer formed upon the surface of the titanium target.

17. The method of claim 16 wherein the second titanium rich titanium nitride layer is formed upon the surface of the titanium target through in-situ nitrogen plasma processing of the titanium target.

18. The method of claim 16 wherein the titanium target is sequentially sputtered in-situ in an argon sputtering atmosphere followed by an argon:nitrogen sputtering atmosphere.

19. The method of claim 13 wherein the substantially stoichiometric titanium nitride layer, the titanium rich titanium nitride layer and the aluminum containing conductor layer are patterned sequentially in-situ through a Reactive Ion Etch (RIE) dry plasma etch method.

20. An integrated circuit having a void free titanium nitride Anti-Reflective Coating (ARC) layer formed upon an aluminum containing conductor layer comprising:

a semiconductor substrate having a series of semiconductor devices formed within and upon the semiconductor substrate;

an aluminum containing conductor layer formed over the semiconductor substrate and the semiconductor devices;

a titanium rich titanium nitride layer formed upon the aluminum containing conductor layer, the titanium rich titanium nitride layer having a titanium:nitrogen molar ratio of greater than 1.1:1 to about 1.2:1; and a substantially stoichiometric titanium nitride layer formed upon the titanium rich titanium nitride layer, the substantially stoichiometric titanium nitride layer having a titanium:nitrogen molar ratio of from about 1.0:1 to no greater than 1.1:1.

21. The integrated circuit of claim 20 wherein:

the thickness of the titanium rich titanium nitride layer is from about 10 to about 200 angstroms; and the thickness of the substantially stoichiometric titanium nitride layer is from about 50 to about 1500 angstroms.

22. The integrated circuit of claim 20 wherein the titanium rich titanium nitride layer and the substantially stoichiometric titanium nitride layer are formed sequentially in-situ through a Physical Vapor Deposition (PVD) sputtering method employing a titanium target.

23. The integrated circuit of claim 22 wherein the titanium target has a second titanium rich titanium nitride layer formed upon the surface of the titanium target.

24. The integrated circuit of claim 23 wherein the second titanium rich titanium nitride layer is formed upon the surface of the titanium target through in-situ nitrogen plasma processing of the titanium target.

25. The integrated circuit of claim 23 wherein the titanium target is sequentially sputtered in-situ in an argon sputtering atmosphere followed by an argon:nitrogen sputtering atmosphere.

* * * * *